United States Patent [19]

Williams

[11] 3,805,147

[45] Apr. 16, 1974

[54] ZERO-CROSSING TRIGGER CIRCUIT FOR FIRING SEMICONDUCTOR DEVICES AT ZERO VOLTAGE

[75] Inventor: Richard J. Williams, Carson, Calif.

[73] Assignee: International Rectifier Corporation, Los Angeles, Calif.

[22] Filed: May 15, 1972

[21] Appl. No.: 253,280

[52] U.S. Cl......... 323/21, 307/252 UA, 323/22 SC, 323/24, 323/38

[51] Int. Cl............................................. H01h 9/56

[58] Field of Search........ 307/133, 252 UA; 323/18, 323/21, 22 SC, 24, 34, 38

[56] References Cited

UNITED STATES PATENTS

| | | | |
|---|---|---|---|
| 3,486,042 | 12/1969 | Watrous | 323/22 SC |
| 3,359,483 | 12/1967 | Biard | 323/21 |
| 3,319,152 | 5/1967 | Pinckaers | 323/22 SC |
| 3,358,218 | 12/1967 | Halpin | 323/22 SC |
| 3,463,933 | 8/1969 | Kompelien | 307/133 |

*Primary Examiner*—A. D. Pellinen
*Attorney, Agent, or Firm*—Sidney G. Faber

[57] ABSTRACT

A zero voltage triggering circuit for triggering semiconductor devices consists of a module which is applicable to single and three-phase operation for controlling the firing of a semiconductor device in a region about zero instantaneous voltage of the a-c power circuit. At least one pilot thyristor is connected in series with the main line, and the gate-to-cathode circuit of the semiconductor device to be controlled. The pilot thyristor is, in turn, fired by a light-activated transistor amplifier which is turned on in response to an input control signal to enable the firing of the thyristor. A further transistor prevents the application of gate current to the pilot thyristor until the main line voltage is within some small voltage range about a zero voltage "window".

9 Claims, 5 Drawing Figures

PATENTED APR 16 1974

3,805,147

ZERO-CROSSING TRIGGER CIRCUIT FOR FIRING SEMICONDUCTOR DEVICES AT ZERO VOLTAGE

BRIEF SUMMARY OF THE INVENTION

This invention relates to a zero-crossing control circuit for generating an output firing signal for firing a semiconductor device when the voltage between its main electrode is approximately zero, and for preventing the firing of the main semiconductor device when the voltage between its main electrodes is greater than some given value.

Zero-crossing control circuits are generally well-known and are used to prevent the firing of a semiconductor device, such as a thyristor or triac, when the voltage between the device main electrodes is greater than some given value. Circuits of this general type are shown, for example, in U.S. Pat. Nos. 3,526,791, 3,521,123 and 3,577,177.

The present invention is directed to a novel circuit for gating thyristors or triacs exclusively in the zero-crossing region of the voltage of the alternating current power source which contains the device being controlled. The circuit of the invention has a relatively universal nature in that one or more modules can be used for single and three-phase operation over a wide range of line voltages, for example, from 60 to 480 volts R.M.S. Other important advantages of the novel circuit of the invention are that the control module is unaffected by lagging power factor loads, and that the device provides ample triggering energy for even the least sensitive semiconductor device which is to be controlled. Finally, a significant advantage of the invention is that it is simple in nature, and has a minimum number of components and thus can be supplied at low cost and has high reliability.

In accordance with a first embodiment of the invention, two pilot thyristors are connected in series with one another and to the gate of the device to be controlled. The use of the pilot device substantially reduces the bulk of the triggering circuit and its power dissipation, and insures positive gating action for even the most insensitive power thyristor or triac. These pilot thyristors are gated by the generation of an input gating signal from an input circuit which can be light-activated. The actual turn-on of the thyristor, however, is further controlled by transistors which short the pilot thyristor emitter so long as the power line voltage is greater than some given value. Thus, the pilot thyristors are turned on only after a main firing signal is received, and only during the time that the main line voltage is within some given "window" or range of instantaneous voltages about a zero voltage point.

In a second embodiment of the invention, gating energy for the control circuit and for the power transistor is derived directly from the power line containing the devices to be controlled with true zero-voltage switching being achieved by phase-shifting a control signal taken from the line to be controlled and then using this phase shift to insure firing of a pilot thyristor as the instantaneous line voltage passes through zero.

DETAILED DESCRIPTION OF THE EMBODIMENTS OF THE INVENTION

Figure 1:
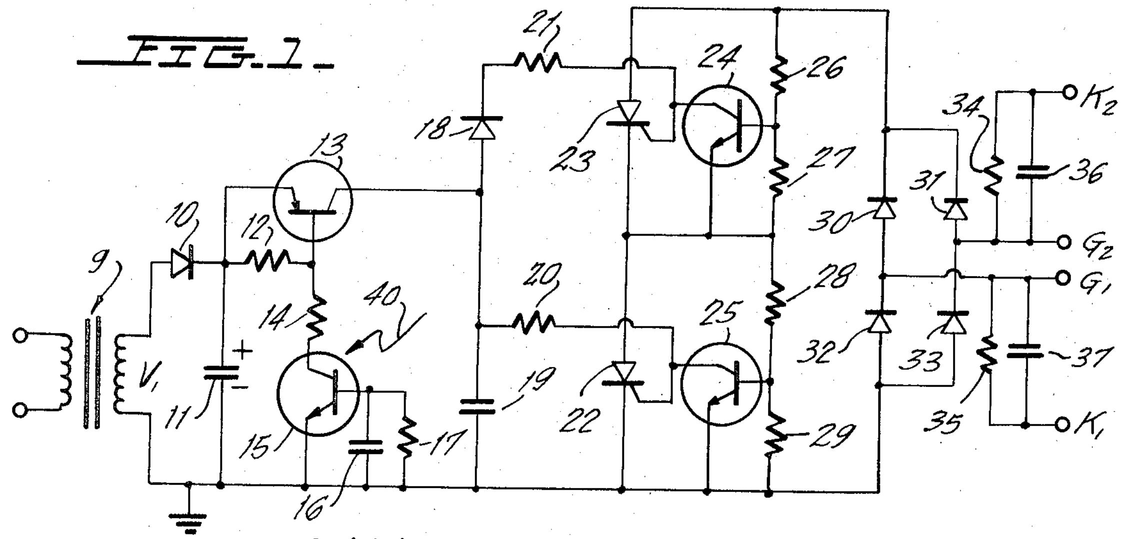
FIG. 1 is a circuit diagram of an embodiment of the invention.
Figure 2:
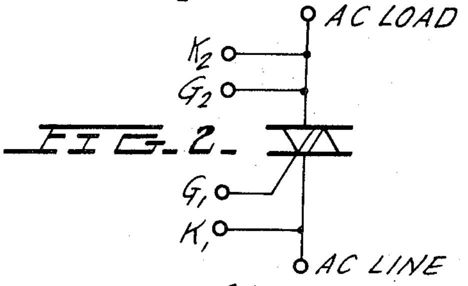
FIG. 2 illustrates the arrangement of input terminals of the circuit of FIG. 1 when the main power device to be controlled is a triac.
Figure 3:
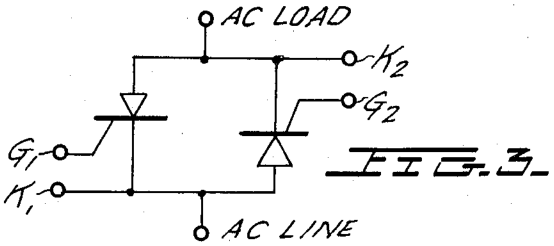
FIG. 3 is similar to FIG. 2, but shows the terminal arrangement of the output terminals of the circuit of FIG. 1 where the devices to be controlled are antiparallel-connected thyristors.

Referring first to FIG. 1, there is illustrated therein a circuit which has a control module which can be used individually for the control of either a single triac, as in FIG. 2, or antiparallel-connected thyristors, as in FIG. 3, where a plurality of such modules can be used for multiphase operation.

In the circuit of FIG. 1, any suitable power source is used to drive the control circuit, where the power source is connected to transformer 9 which has a secondary winding which develops an output voltage $V_1$ which could, for example, be 7 volts R.M.S. A d-c power source is then formed of diode 10 and capacitor 11, where the d-c voltage on capacitor 11 drives the remainer of the circuit. The positive side of capacitor 11 is connected to resistor 12 and to the emitter of transistor 13. Resistor 12 is then connected in series with resistor 14 and the collector-emitter circuit of transistor 15, which may be a phototransistor. The base of phototransistor 15 is connected to ground or the negative terminal of capacitor 11 through the filter capacitor 16 and resistor 17.

The collector of transistor 13 is then connected between diode 18 and filter-capacitor 19 and to one terminal of resistor 20. Diode 18 is also connected to a resistor 21, where resistors 20 and 21 are current-dividing resistors which connect the output of transistor 13 into the gates of thyristors 22 and 23, respectively. Note that thyristors 22 and 23 are connected in series with one another and consist of the pilot thyristors, the purpose of which will be described hereinafter. Resistor 21 and the gate of thyristor 23 are connected to the collector of transistor 24, while the gate of thyristor 22 and resistor 20 is connected to the collector of transistor 25.

A pair of voltage dividers are then provided for the bases of transistors 24 and 25, respectively, and consist of resistor pairs 26-27 and 28-29, respectively. The emitters of transistors 24 and 25 are then connected to the junction between thyristors 22 and 23 and to the bottoms of resistors 27 and 29, respectively.

A single-phase, full-wave rectifier bridge is then provided, consisting of diodes 30, 31, 32 and 33, with the d-c bridge terminals connected to the top of resistor 26 and the bottom of resistor 29, respectively. The a-c terminals of the bridge are then connected to the terminals marked $G_1$ and $G_2$, corresponding to two gate terminals for two respective devices which are to be controlled. Gate terminals $G_1$ and $G_2$ are connected to respective cathode terminals $K_1$ and $K_2$, respectively, through resistors 35 and 34, respectively, and their respective parallel-filter capacitors 37 and 36.

Where the device to be controlled by the control module of FIG. 1 is a single triac, as in FIG. 2, the terminals $K_2$ and $G_2$ are shorted, while the terminals $G_1$ and $K_1$ are connected, respectively, to the gate and cathode of the triac device. Where antiparallel-connected thyristors are to be used, the gate and cathode terminals $G_1$, $G_2$, $K_1$ and $K_2$ are connected as shown in FIG. 3.

The operation of the circuit of FIG. 1 is as follows, assuming that a triac is connected to the circuit output in the manner shown in FIG. 2.

The capacitor 11 is charged and applies a positive voltage to the emitter of transistor 13. The phototransistor 15 will be assumed to be shut off, so that there is no base drive for transistor 13 and, accordingly, no current flows into the gates of pilot thyristors 22 and 23. The series-connected pilot thyristors 22 and 23 are connected in series with the full-wave rectified output of the a-c circuit connected between terminals $K_1$ and $K_2$, but these devices are off so that no current flows into the gate $G_1$ (or gate $G_2$).

If it is now desired to fire the triac of FIG. 2 in response to some input signal, such as light, from some suitable source, shown by the arrow 40 in FIG. 1, the phototransistor 15 conducts to provide base drive for transistor 13. The transistor 13, therefore, turns on, to allow current to flow toward the gates of pilot thyristors 22 and 23. This gating current, however, is shunted through the transistors 25 and 24, respectively, so long as the instantaneous voltage in the a-c circuit and across the thyristor of FIG. 2 exceeds some given value. That is to say, transistors 24 and 25 are so designed that they conduct so long as the potential between the resistor dividers 26 and 27 and 28 and 29, respectively, exceeds some given value, for example, 10 volts, so that base drive appears on transistors 24 and 25, shunting potential gate current away from pilot thyristors 23 and 22, respectively. Note further that this provides effective emitter shorting to improve the *dv/dt* capability of pilot thyristors 22 and 23 so that these devices will remain off even under a high rate-of-rise-of-voltage between their main electrodes.

Once the instantaneous voltage across the triac of FIG. 2 is less than the threshold voltage (for example 10 volts), the transistors 24 and 25 cut off to enable gate current flowing through resistors 20 and 21 to fire pilot thyristors 22 and 23. The firing of these devices then permits the flow of substantial current into the gate $G_1$ (and gate $G_2$) in order to insure firing of the triac device of FIG. 2 within the voltage window defined between ±10 volts of the a-c power voltages.

Typical component values which can be used in connection with the circuit of FIG. 1 as well as typical component types are as follows:

| COMPONENT NUMERAL | | TYPICAL COMPONENT VALUES DESCRIPTION |
|---|---|---|
| (a) | Resistors | |
| | 12 | 100K ¼ω±10% |
| | 14 | 10K ½ω±10% |
| | 17 | 1M ½ω±10% |
| | 20 | 2.2K ½ω±10% |
| | 21 | 2.2K ½ω±10% |
| | 26 | 100K 1ω±10% |
| | 27 | 22K ¼ω±10% |
| | 28 | 100K 1ω±10% |

-Continued

| COMPONENT NUMERAL | | TYPICAL COMPONENT VALUES DESCRIPTION |
|---|---|---|
| | 29 | 4.7K ½ω±10% |
| | 34 | 22r ½ω±10% |
| | 35 | 22r ½ω±10% |
| (b) | Capacitors | |
| | 11 | 50μF/25V |
| | 16 | 250 pF/1KV |
| | 19 | 0.1μF/50V |
| | 36 | 0.1μF/50V |
| | 37 | 0.1μF/50V |
| (c) | Diodes | |
| | 10 | 10D2 (INTERNATIONAL RECTIFIER) |
| | 18 | 10D10 (INTERNATIONAL RECTIFIER) |
| | 30 | 10D10 (INTERNATIONAL RECTIFIER) |
| | 31 | 10D10 (INTERNATIONAL RECTIFIER) |
| | 32 | 10D10 (INTERNATIONAL RECTIFIER) |
| | 33 | 10D10 (INTERNATIONAL RECTIFIER) |
| (d) | Other Semiconductors | |
| | 13 | IRTR52 (INTERNATIONAL RECTIFIER) |
| | 15 | PHOTOTRANSISTOR |
| | 23 | IR106D (INTERNATIONAL RECTIFIER) |
| | 22 | IR106D (INTERNATIONAL RECTIFIER) |
| | 24 | IRTR53 (INTERNATIONAL RECTIFIER) |
| | 25 | IRTR53 (INTERNATIONAL RECTIFIER) |

Figure 4:
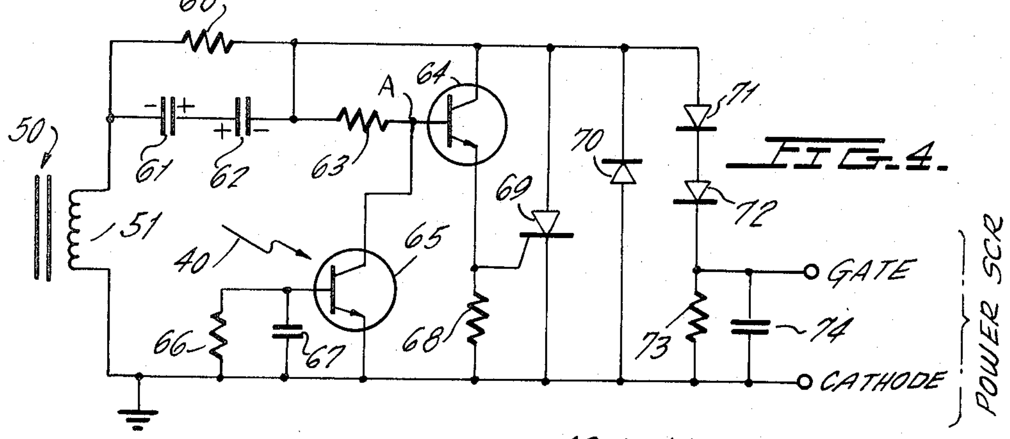
FIG. 4 is a circuit diagram of a second embodiment of the invention in which control power is derived from the line being protected.
Figure 5:
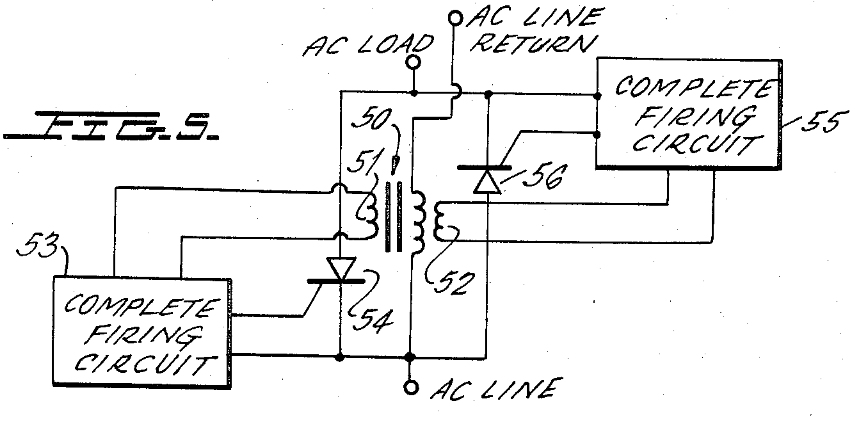
FIG. 5 illustrates the manner in which two control circuits of the type shown in FIG. 4 may be connected to control the firing of thyristors which are associated with the main power line.

A second embodiment of the invention is illustrated in FIG. 4. The circuit of FIG. 4 differs from that of FIG. 1 in that gating energy for the power thyristor is derived directly from the step-down transformer, such as transformer 50, which is energized from the line voltage. Thus, as shown in FIG. 5, transformer 50 may be connected between the two a-c line terminals, as shown for the primary of transformer 50 which has output or secondary windings 51 and 52. A firing module 53, which is shown in FIG. 4, is then associated with thyristor 54, while an identical firing module 55 is associated with thyristor 56. Note that thyristor 56 may be a diode for three-line control of three-phase a-c power.

Referring to the circuit of FIG. 4, the output voltage of secondary winding 51 may be approximately 7 volts R.M.S., and this output voltage is connected into a phase-shifting circuit consisting of resistor 60 and the series-connected capacitors 61 and 62, which phase-shifts the current drawn from transformer winding 51 in a leading direction by 30° to 60° at a 60 Hz. line frequency.

The output of the phase shift circuit is connected through a resistor 63 to the base of transistor 64, and to the emitter of phototransistor 65. The base of phototransistor 65 is connected to ground and to its emitter through the resistor 66 and filter capacitor 67. The emitter of transistor 64 is then connected in series with resistor 68, with the top of resistor 68 being connected to the gate of pilot thyristor 69.

A diode 70 is then connected in an antiparallel direction relative to thyristor 69 and an antiparallel direction with respect to series diodes 71 and 72 and output resistor 73. A filter capacitor 74 is connected across resistor 73 and the gate and cathode output terminals are similarly connected across resistor 73. Note that in FIG. 5 these gate and cathode output terminals are connected to the gate and cathode of the thyristor 54.

The operation of the circuit of FIG. 4, when used as the firing control module 53 (and 55) in the circuit of FIG. 5 is as follows.

When the circuit is not to produce a firing signal, phototransistor 65 blocks, so that transistor 64 can conduct shortly after the point A becomes positive. That is, since the base resistor 63 is also connected to the point A, transistor 64 will conduct when the point becomes slightly positive. The conduction of transistor 64 causes the gating or firing of pilot thyristor 69, which, in turn, shunts away all available gating current from diodes 71 and 72 which would otherwise flow through resistor 73 to develop an output gating signal for thyristor 54 of FIG. 5. Note that pilot thyristor 69 will remain on for a full half cycle of the supply current, thereby preventing the triggering of the power thyristor 54 even if transistors 65 and 64 combine to remove gate drive from pilot thyristor 69.

In order to initiate a gating signal for the power thyristor 54, phototransistor 65 is activated by a suitable light source (again shown as input radiation 40 in FIG. 4), thereby causing the conduction of power transistor 65 which, in turn, removes base drive from transistor 64, so that transistor 64 cuts off, which, in turn, removes the gate firing signal from controlled pilot thyristor 69.

Once a new positive half cycle approaches, pilot thyristor 69 will be off, so that gating current can flow through diodes 71 and 72 in order to develop a firing signal across resistor 73, in the range of time that the voltage across the main device to be fired is extremely low. Indeed, precise zero voltage switching can be obtained with the circuit of FIG. 4.

It should be specifically noted that the thyristor 69 will normally conduct when, at the beginning of any positive half wave, no signal has been received by phototransistor 65 (or any other suitable control transistor), so that firing of the main power transistor until just prior to the next positive half wave is not possible.

Satisfactory operation has been obtained for the circuit of FIG. 4 when using the following components:

| COMPONENT NUMERAL | | TYPICAL COMPONENT VALUES DESCRIPTION |
|---|---|---|
| (a) | Resistors | |
| | 60 | 50r ±10% 3ω |
| | 63 | 22K ±10% ½ω |
| | 66 | 1M ±10% ½ω |
| | 68 | 1K ±10% ½ω |
| | 73 | 100r ±10% ½ω |
| (b) | Capacitors | |
| | 61 | 200μF/12V |
| | 62 | 200μF/12V |
| | 67 | 250 pF/1KV |
| | 74 | 0.1μF/50V |
| (c) | Diodes | |
| | 70 | 10D2 (INTERNATIONAL RECTIFIER) |
| | 71 | 10D2 (INTERNATIONAL RECTIFIER) |
| | 72 | 10D2 (INTERNATIONAL RECTIFIER) |
| (d) | Other Semiconductors | |
| | 64 | IRTR53 (INTERNATIONAL RECTIFIER) |
| | 65 | PHOTOTRANSISTOR |
| | 69 | IR106A (INTERNATIONAL RECTIFIER) |

Although there has been described a preferred embodiment of this novel invention, many variations and modifications will now be apparent to those skilled in the art. Therefore, this invention is to be limited, not by the specific disclosure herein, but only by the appended claims.

I claim:

1. A control circuit for generating a firing signal at a pair of output terminals to fire a semiconductor switching device connected to said output terminals only at the time the instantaneous voltage of an a-c circuit is below a given absolute value; said control circuit comprising, in combination:

a control voltage circuit, first transistor means connected to said control voltage circuit and operable in response to an input control signal to enable said control circuit to generate said firing signal when the instantaneous voltage of said a-c circuit is below said given absolute value, a pilot thyristor having a gate circuit connected to said first transistor circuit means and having a pair of main electrodes, a second transistor circuit means connected to said gate circuit and coupled to said a-c circuit, whereby said second transistor circuit means is conductive when the voltage of said a-c circuit exceeds said given absolute value, thereby to prevent the firing of said pilot thyristor by said first transistor circuit means until said voltage of said a-c circuit is below said given absolute value, and a rectifier circuit means having a-c and d-c terminal means; said a-c terminal means connected to said pair of output terminals; said d-c terminal means connected to said pair of pilot thyristor main electrodes; said rectifier circuit means coupling said a-c circuit to said second transistor circuit means.

2. The control circuit of claim 1 wherein said first transistor means includes a first phototransistor and a second transistor; the base of said second transistor connected in series with the emitter-collector circuit of said first transistor; the emitter-collector circuit of said second transistor being connected between said control voltage circuit and said gate circuit of said pilot thyristor, whereby input radiation, defining said input control signal, causes conduction of said first phototransistor, to in turn cause conduction of said second transistor to apply gating current toward said gate circuit of said pilot thyristor.

3. The control circuit of claim 1 wherein said second transistor circuit means includes a control transistor having its emitter-collector circuit connected across said gate circuit of said pilot thyristor whereby, when said control transistor conducts, gate current cannot be injected into said gate circuit of said pilot thyristor; the base of said control transistor being coupled to said a-c circuit, whereby said control transistor is conductive when the voltage of said a-c source exceeds said given absolute value.

4. The control circuit of claim 1 wherein said semiconductor switching device comprises a relatively high power semiconductor device; said high power semiconductor device having a cathode electrode and a gate electrode connected to respective ones of said pair of output terminals.

5. The control circuit of claim 1 wherein said rectifier circuit means comprises a single-phase, full-wave bridge connected rectifier; the d-c terminals of said rectifier circuit means being connected in series with said pilot thyristor main electrodes; the a-c terminals of said rectifier circuit means being connected to first and second output gate terminals; first and second impedance means; and first and second cathode terminals connected in series with said first and second impedance means respectively to said first and second output gate terminals respectively and to said a-c circuit; said first gate terminal and said first cathode terminal defining said pair of output terminals.

6. The device of claim 3 which further includes a resistive voltage divider circuit connected across said rectifier circuit means and across said pilot thyristor; said base of said control transistor being connected to an intermediate point in said resistive voltage divider circuit.

7. The control circuit of claim 2 wherein said second transistor circuit means includes a control transistor having its emitter-collector circuit connected across said gate circuit of said pilot thyristor whereby, when said control transistor conducts, gate current cannot be injected into said gate circuit of said pilot thyristor; the base of said control transistor being coupled to said a-c circuit, whereby said control transistor is conductive when the voltage of said a-c source exceeds said given absolute value.

8. The control circuit of claim 7 wherein said rectifier circuit means comprises a single-phase, full-wave bridge connected rectifier; the d-c terminals of said rectifier being connected in series with said pilot thyristor main electrodes; the a-c terminals of said rectifier circuit means being connected to first and second output gate terminals; and first and second cathode terminals connected to said first and second output gate terminals respectively and to said a-c circuit; said first gate terminal and said first cathode terminal defining said pair of output terminals.

9. The device of claim 8 which further includes a resistive voltage divider circuit connected across said rectifier circuit means and across said pilot thyristor; said base of said control transistor being connected to an intermediate point in said resistive voltage divider circuit.

* * * * *